(12) United States Patent
Isoda

(10) Patent No.: US 7,218,041 B2
(45) Date of Patent: May 15, 2007

(54) LIGHT EMITTING DEVICE PROVIDED WITH ELECTRICALLY CONDUCTIVE MEMBERS HAVING HIGH THERMAL CONDUCTIVITY FOR THERMAL RADIATION

(75) Inventor: Hiroto Isoda, Yamanashi-ken (JP)

(73) Assignee: Citizen Electronics Co., Ltd., Yamanashi-Ken (JP)

( * ) Notice: Subject to any disclaimer, the term of this patent is extended or adjusted under 35 U.S.C. 154(b) by 200 days.

(21) Appl. No.: 10/700,494

(22) Filed: Nov. 5, 2003

(65) Prior Publication Data
US 2004/0095782 A1   May 20, 2004

(30) Foreign Application Priority Data
Nov. 15, 2002  (JP) .............................. 2002-332877

(51) Int. Cl.
H01J 61/52    (2006.01)
H01J 63/04    (2006.01)
H01J 1/62     (2006.01)
F21V 29/00    (2006.01)

(52) U.S. Cl. ...................... 313/11; 313/512; 313/506; 362/373; 362/555

(58) Field of Classification Search ................ 313/512; 362/294
See application file for complete search history.

(56) References Cited

U.S. PATENT DOCUMENTS

| | | | | |
|---|---|---|---|---|
| 6,045,240 A * | 4/2000 | Hochstein | .................... | 362/294 |
| 6,121,995 A * | 9/2000 | Kattner | ........................ | 372/35 |
| 6,517,218 B2 * | 2/2003 | Hochstein | .................... | 362/294 |
| 6,590,773 B1 * | 7/2003 | Lin | ............................. | 362/373 |
| 6,964,501 B2 * | 11/2005 | Ryan | .......................... | 362/373 |
| 6,999,318 B2 * | 2/2006 | Newby | ........................ | 362/373 |
| 2001/0030866 A1 * | 10/2001 | Hochstein | .................... | 362/294 |

\* cited by examiner

Primary Examiner—Sikha Roy
Assistant Examiner—Natalie K. Walford
(74) Attorney, Agent, or Firm—Dennison, Schultz & MacDonald

(57) ABSTRACT

A light emitting device has a plurality of conductive members with good heat conductivity provided in a base member, the conductive members are isolated by insulating members provided between the conductive members. A light emitting element device is mounted on the base member. An light emitting diode is provided in the light emitting device and mounted on conductive member. A projection is outwardly projected from the heat conductive member for cooling the LED.

15 Claims, 10 Drawing Sheets

LIGHT EMITTING DEVICE PROVIDED WITH ELECTRICALLY CONDUCTIVE MEMBERS HAVING HIGH THERMAL CONDUCTIVITY FOR THERMAL RADIATION

BACKGROUND OF THE INVENTION

The present invention relates to a light emitting device using a light emitting diode (LED).

FIG. 16 is a perspective view showing a conventional light emitting device disclosed in Japanese Patent 3,302,203. The light emitting device 1 comprises a substrate 2 made of resin such as epoxy resin, a pair of electrodes 2a and 2b fixed to the substrate 2 at upper and lower side thereof, an LED 3 mounted on the electrode 2a and connected to the electrode 2b by a wire 4, and an sealing member 5 made of a transparent resin for sealing the LED 3.

The light emitting device 1 is mounted on a print substrate 6, connecting the electrodes 2a and 2b with a pair of conductive patterns 6a and 6b.

When current is applied to the LED 3 from the patterns 6a and 6b through the electrodes 2a and 2b, the LED 3 emits light 7.

The thickness of the light emitting device 1 can be reduced because the device is mounted on the print substrate 6 through thin electrodes 2a and 2b. However, the substrate 2 made of resin such as epoxy resin has a very low heat conductivity which is about one-hundredth of that of copper. Therefore, heat emitted from the LED 3 scarcely transmitted to the print substrate 6. Consequently when a high current is applied to the LED in order to produce high brightness, the emitted heat becomes high temperature, which causes junctions in the LED to degrade, and the sealing member 5 to discolor which decreases the transparency of the member. Thus, the quality of the LED device largely reduces.

FIG. 17 is a perspective view of another conventional light emitting device disclosed in Japanese Patent Laid Open 11-307820, which is improved in heat radiation.

The light emitting device 10 comprises a pair of conductive members 11a and 11b made of metal having high heat conductivity, an insulation member 12 made of resin for insulating the conductive members 11a and 11b and combining the members. The insulation member has an opening 13 having an elongated circular shape. A part of each of the conductive members 11a, 11b is exposed in the opening. An LED 14 is secured to exposed parts of the conductive members 11a, 11b, so that the LED 14 is electrically and thermally connected to conductive members 11a and 11b. The LED 14 is sealed by a transparent sealing member 15.

The light emitting device 10 is mounted on a print substrate 16, and the conductive members 11a and 11b are connected to a pair of conductive patterns 16a and 16b by solders.

When current is applied to the LED 14 from the patterns 16a and 16b through conductive members 11a and 11b, the LED emits light 17. Heat generated in the LED 14 is transmitted to the print substrate 16 through the conductive members 11a and 11b, so that the heat is efficiently radiated from the print substrate 16 if the substrate is made of a material having high heat conductivity.

However, the print substrate 16 is generally made of cheap material such as an epoxy resin. As described above, the epoxy resin has low heat conductivity. Therefore, the heat is not sufficiently transmitted to the print substrate, thereby rising the temperature of the LED, and reducing the quality thereof.

Here, if the print substrate is made with a metal having high heat conductivity, the heat radiation problem is resolved. However, the print substrate is not provided for mounting only the light emitting device, but for mounting other electrical parts such as CPU, memories and others.

For such other parts, the print substrate having high heat conductivity is not necessary. To the contrary, such as a print substrate made of metal causes the manufacturing cost of the electric device to increase.

SUMMARY OF THE INVENTION

An object of the present invention is to provide a light emitting device having an effective means for heat release.

According to the present invention, there is provided a light emitting device comprising a base member, a plurality of conductive members and insulating members for securing and isolating each conductive member provided in the base member, a light emitting diode assembly mounted on the base member, a light emitting diode provided in the light emitting device and mounted on the electric conductive member with high heat conductivity, connecting means for electrically connecting the light emitting element with the conductive member, a projection outwardly stretched for heat release from the other side of the conductive member thereon the light emitting diode mounted.

A circuit substrate is further provided in the light emitting device, and the connecting means includes a circuit pattern provided on the circuit substrate and a wire connecting the light emitting diode with the circuit pattern.

A print substrate having an opening, is provided the projection is inserted in the opening, and the base member is secured to the print substrate.

The circuit substrate has an opening, the light emitting diode is mounted on the conductive member exposed in the opening.

The conductive member has electrically conductivity for applying the current to the light emitting diode.

The print substrate has a light emitting diode driving pattern connected to the conductive member for applying the current to the light emitting diode, and a heat radiation pattern is formed on an inside wall of the opening and on the underside of the print substrate.

A cooling member is secured to the underside of the print substrate for cooling the light emitting diode.

The present invention further provides a method for manufacturing a light emitting device comprising the steps of combining of conductive members with insulating members such as an insulation resin to form a base member assembly, forming a circuit substrate assembly having a plurality of openings and circuit patterns, securing the circuit substrate assembly to the base member assembly, mounting each light emitting diode on the conductive member exposed in each opening of the circuit substrate assembly, connecting each light emitting diode with each circuit pattern by at least a wire, sealing the light emitting diodes and the wires on the circuit substrate assembly with a sealing member such as a transparent resin, and separating each independent light emitting device by dicing.

These and other objects and features of the present invention will become more apparent from the following detailed description with reference to the accompanying drawings.

DETAILED DESCRIPTION OF THE PREFERRED EMBODIMENT

Figure 1:
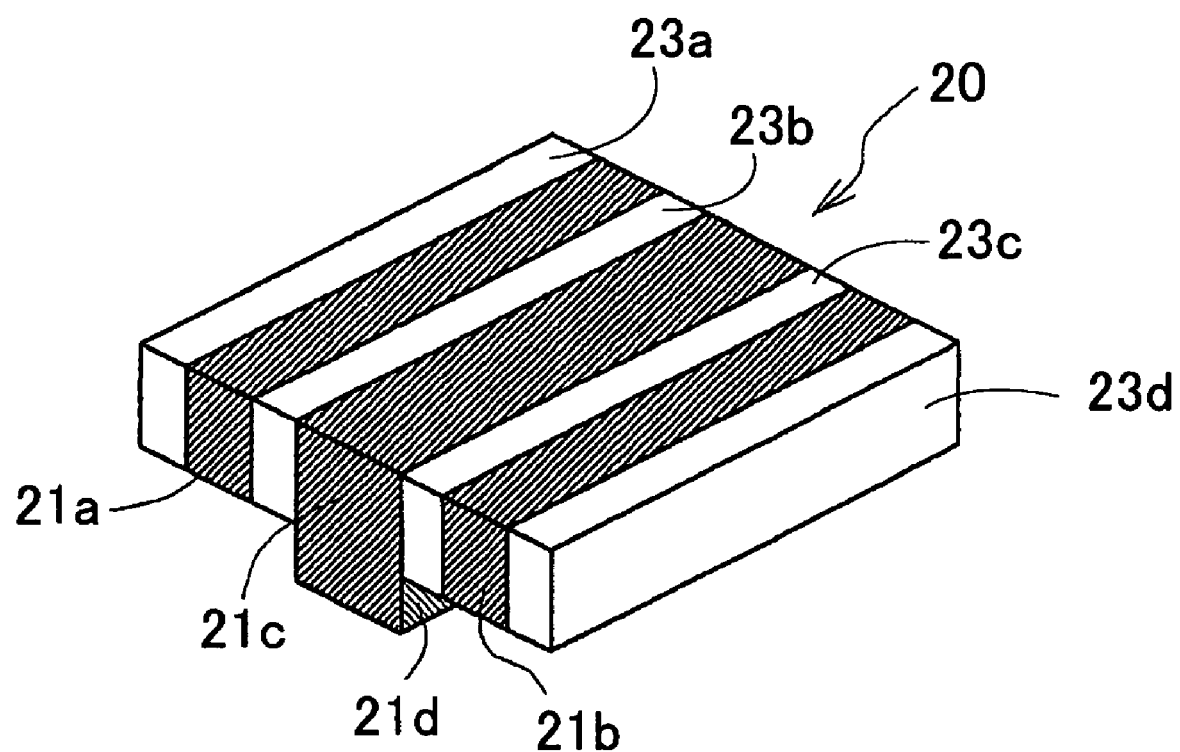
FIG. 1 is a perspective view showing a base member used for a light emitting device of the present invention.
Figure 2:
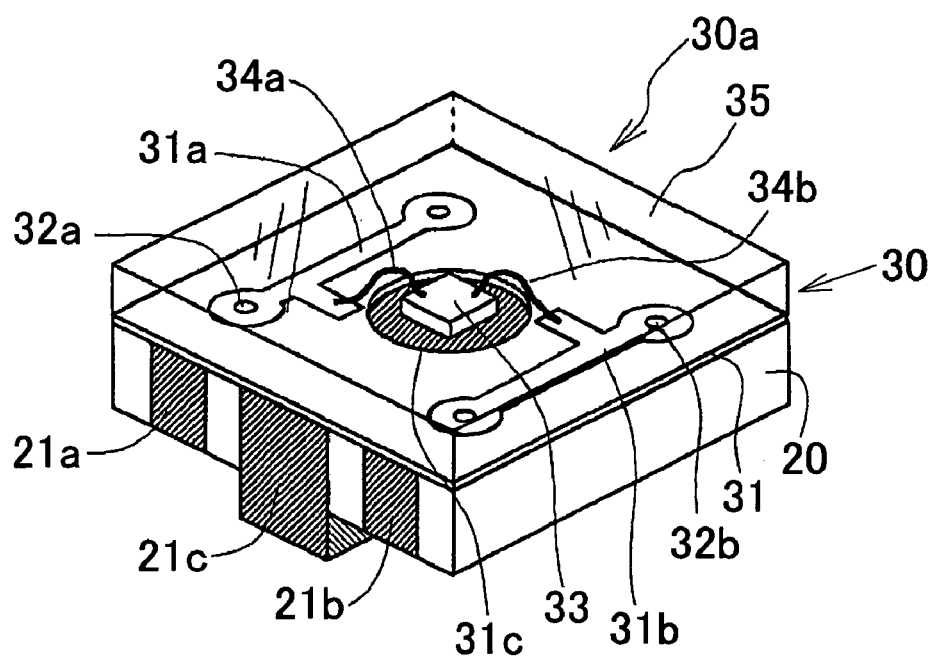
FIG. 2 is a perspective view showing the light emitting device of the present invention.

FIG. 1 is a perspective view showing a base member used for a light emitting device according to a first embodiment of the present invention, and FIG. 2 is a perspective view showing the light emitting device for a first embodiment of the present invention.

A base member 20 comprises electric conductive members 21a, 21b, and 21c, and four insulating members 23a-23d made of resin. The insulating members 23b and 23c electrically isolate the conductive members 21a, 21b and 21c and combine these members. The conductive member 21c is made of a metal having a high heat conductivity. Each of the members has a quadratic prism. The conductive member 21c has a lower projection 21d.

Referring to FIG. 2 showing a light emitting device 30a of the present invention, the light emitting device 30a comprises a light emitting element assembly 30 and the base member 20.

The light emitting element assembly 30 has a circuit substrate 31 secured to the upper surface of the base member 20 by thermo compression bonding. The circuit substrate 31 has a pair of circuit patterns 31a and 31b of copper foil formed on the surface thereof and an opening 31c formed at a central portion, exposing a part of the upper surface of the heat conductive member 21c. Through-holes 32a and 32b are provided in the patterns 31a and 31b for electrically connecting the patterns with the conductive members 21a and 21b. An LED 33 is mounted on the exposed portion of the heat conductive member 21c by Ag paste. Thus, the LED 33 is thermally connected to the heat conductive member 21c. The anode and cathode (not shown) of the LED 33 are connected to the circuit patterns 31a and 31b by wires 34a and 34b. Thus, the electrodes of the LED 33 are electrically connected with conductive members 21a and 21b through patterns 31a and 31b and through-holes 32a and 32b. The LED 33 and wires 34a and 34b are sealed by a sealing member 35.

Figure 3:
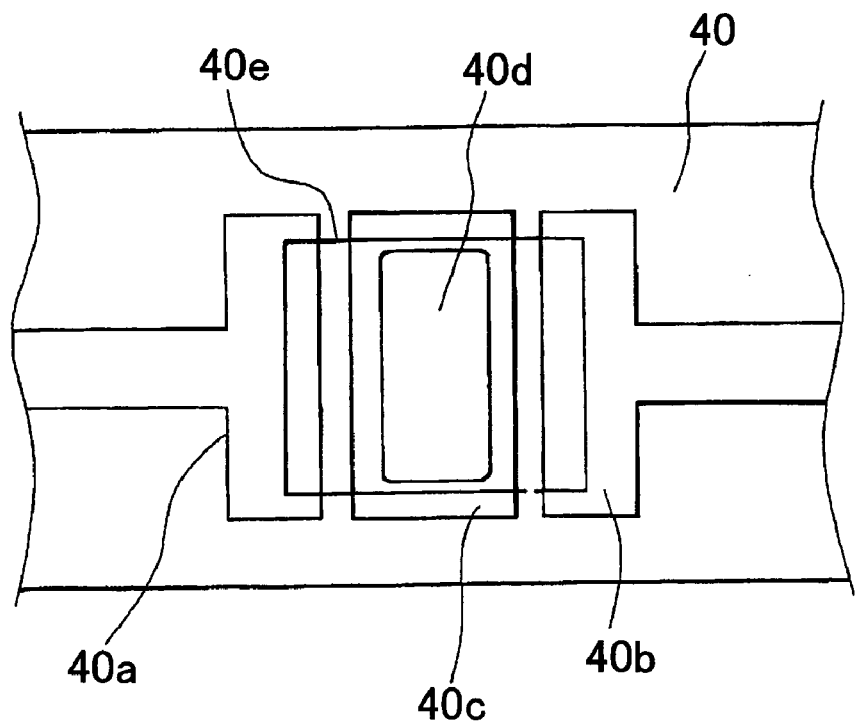
FIG. 3 is a plan view showing a print substrate used for a light emitting device of the present invention.
Figure 4:
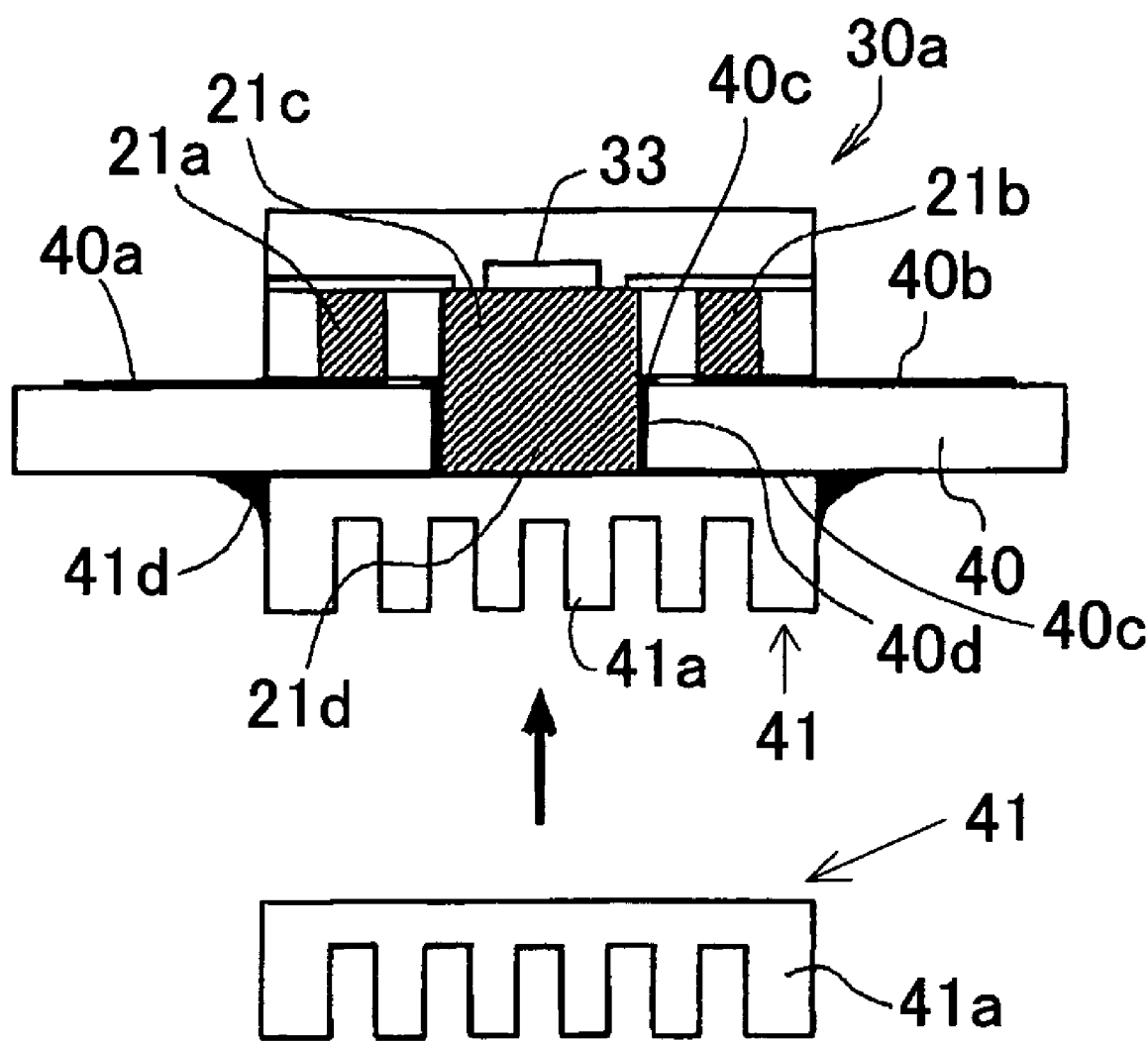
FIG. 4 is a sectional view of the light emitting device mounted on the print substrate set with a cooling member.

FIG. 3 is a plan view showing a print substrate used for a light emitting device of the present invention according to a first embodiment, and FIG. 4 is a sectional view of the light emitting device mounted on the print substrate.

The print substrate 40 has a pair of LED driving patterns 40a and 40b each having a T-shape, and a heat radiation opening 40d having a shape for receiving the lower projection 21d of the heat conductive member 21c. A heat radiation pattern 40c is formed on the surface of the print substrate 40 around the heat radiation opening 40d, on the inside wall of the opening 40d, and on the underside of the print substrate 40.

As shown in FIG. 4, the opening 40d has a depth equal to the height of the projection 21d. The light emitting device 30a is mounted on the print substrate 40, inserting the projection 21d in the opening 40d.

The conductive members 21a and 21b are secured to the LED driving patterns 40a and 40b with a solder (not shown). In FIG. 3, a square line 40e shows a mounting area of the light emitting device 30a. Thus, the LED 33 is electrically connected to the LED driving patterns 40a and 40b through the wires 34a, 34b, patterns 31a, 31b, through-holes 32a, 32b, and conductive members 21a, 21b.

The underside of the projection 21d is at substantially same level as the underside of the print substrate 40. As shown in FIG. 4, a cooling member 41 made of heat transmissive metal and having a plurality of cooling fins 41a is attached to the heat radiation pattern 40c on the underside of the print substrate and secured to the pattern 40c by a solder 41d.

Thus, the LED 33 is thermally connected with the cooling member 41 through the exposed portion of the heat conductive member 21c, projection 21d, and heat radiation pattern 40c.

When a driving voltage is applied to the LED driving patterns 40a and 40b, the voltage is applied to the LED 33 through the conductive members 21a and 21b, through-holes 32a and 32b, patterns 31a and 31b, and wires 34a and 34b. Thus, the LED 33 is driven to emit light, and heats up. The heat of the LED is transmitted to the cooling member 41 through the conductive member 21c as a heat sink and the heat radiation pattern 40c. Thus, the transmitted heat is cooled by the cooling fins 41a.

Although the single LED 33 is mounted on the conductive member 21c in the above described embodiment, a plurality of LEDs 33 may be mounted on the conductive member 21c, the current is applied to each LED through an independent circuit.

Figure 5:
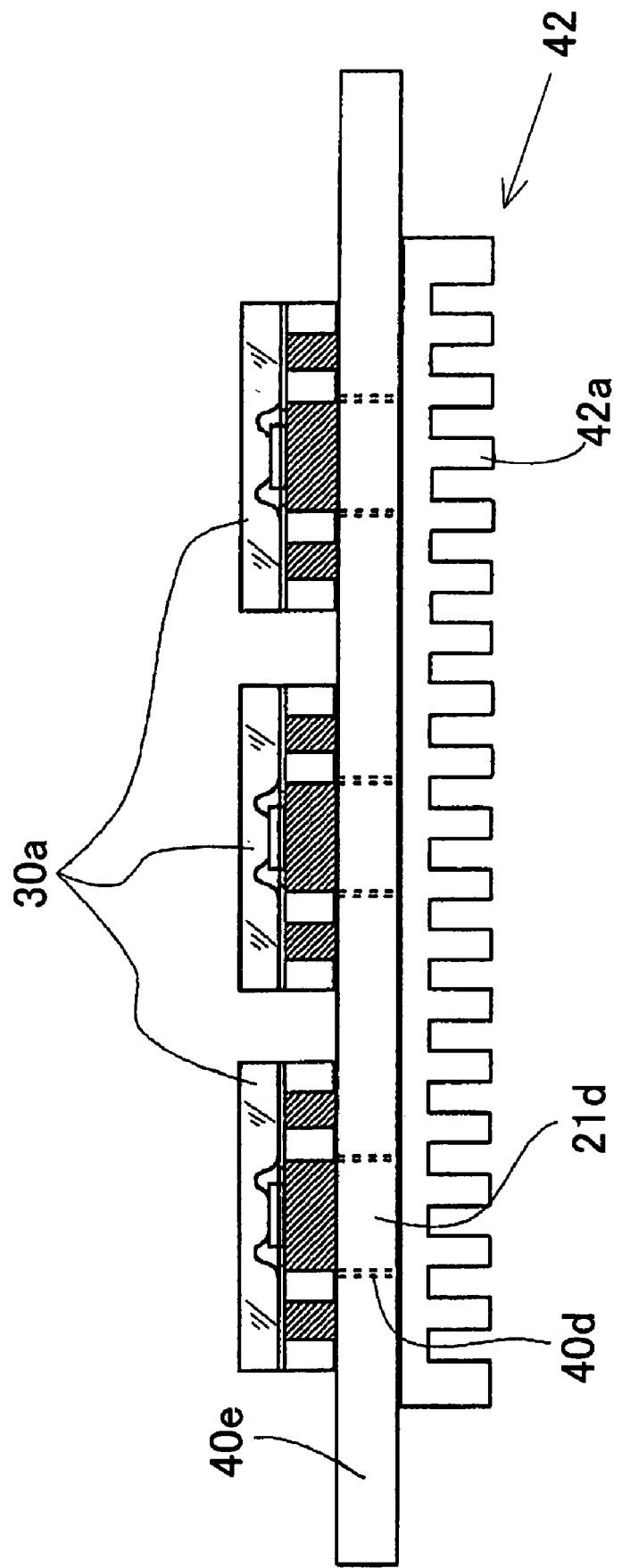
FIG. 5 is a side view of arranged plural light emitting devices mounted on the print substrate showing another example as a first embodiment of the present invention.

FIG. 5 is a side view showing another example of the first embodiment of the present invention. As shown in FIG. 5, three heat radiation openings 40d are formed in a long print substrate 40e. Three light emitting devices 30a are mounted on the print substrate 40, inserting each projection 21d in the heat radiation opening 40d. A long cooling member 42 having a plurality of cooling fins 42a and having construction similar to the cooling member 41 is secured to the underside of the print substrate 40e.

In the example of the light emitting device, since the single print substrate 40e is provided for three light emitting devices 30a, the mounting operations and the construction are simplified, and the area of the device is reduced compared with the area occupied by three independent devices.

Figure 6:
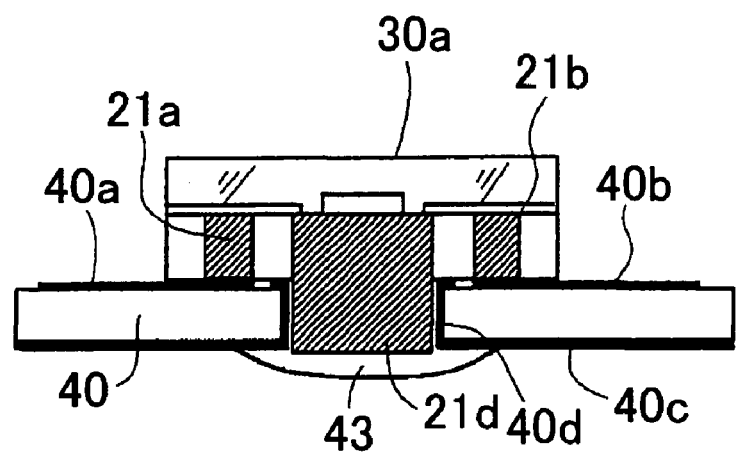
FIG. 6 is a sectional view showing a further another example of the light emitting device of the present invention.

FIG. 6 is a sectional view showing a further another example of the light emitting device of the present invention.

The light emitting device 30a has the heat radiation pattern 40c at the underside of the print substrate, which has a large area compared with that of the first embodiment. The projection 21d is connected with the heat radiation pattern 40c by a wide solder 43 having a large thickness. Therefore, the heat radiation pattern 40c and the solder 43 efficiently radiate the heat from the projection 21d. Since the cooling member 41 is not provided, the mounting operation and construction are simplified, and manufacturing cost is reduced.

Figure 7:
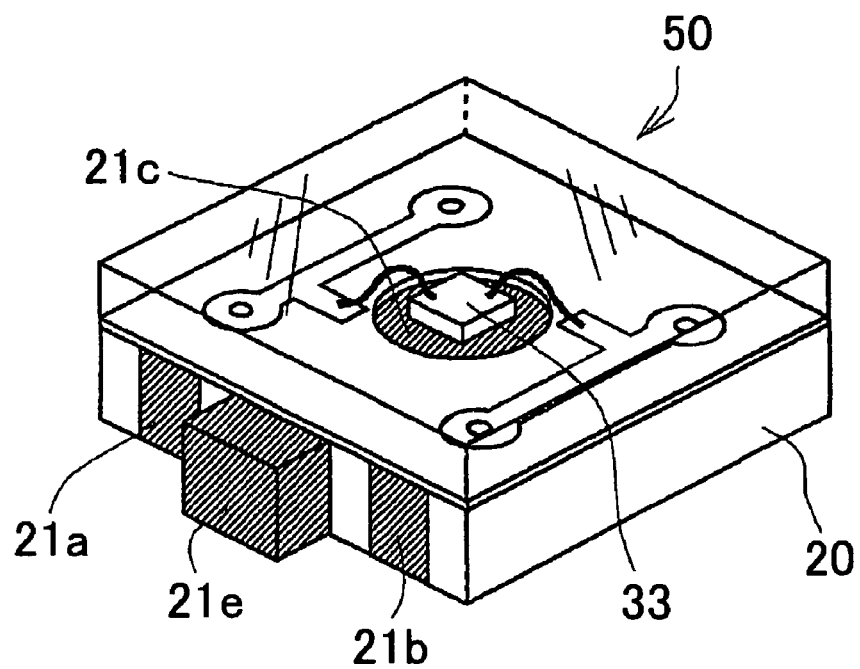
FIG. 7 is a perspective view showing a light emitting device according to a second embodiment of the present invention.

FIG. 7 is a perspective view showing a light emitting device according to a second embodiment of the present invention. The same parts as the first embodiment are identified by the same reference numerals as those of the first embodiment, and the description thereof is omitted. A light emitting device 50 has a heat transmissive member different from the first embodiment.

The heat conductive member 21c has a projection 21e laterally projected from a side end thereof.

Figure 8:
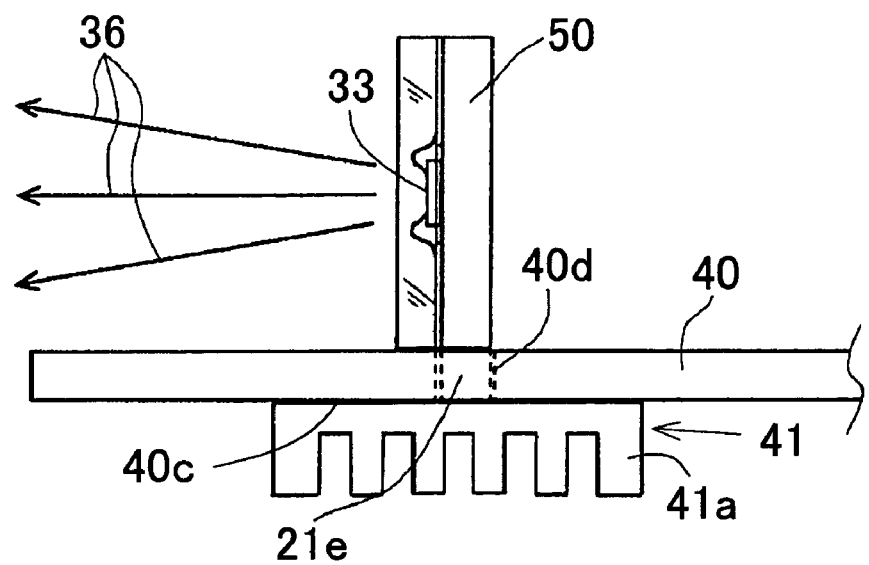
FIG. 8 is a side view showing the light emitting device mounted on a print substrate set with a plurality of cooling fins according to a second embodiment of the present invention.

FIG. 8 is a side view showing the light emitting device 50 mounted on a print substrate. The light emitting device 50 is mounted on the print substrate 40, inserting the lateral projection 21e in the opening 40d. Thus, the light emitting device 50 is mounted in an upright position. Therefore, the LED 33 emits light 36 in a horizontal direction.

The heat emitted by the LED 33 is transmitted to the cooling member 41 through the conductive member with good heat conductivity 21c, and the heat radiation pattern 40c, and radiated from the cooling member 41. Thus, the LED 33 is cooled.

Figure 9:
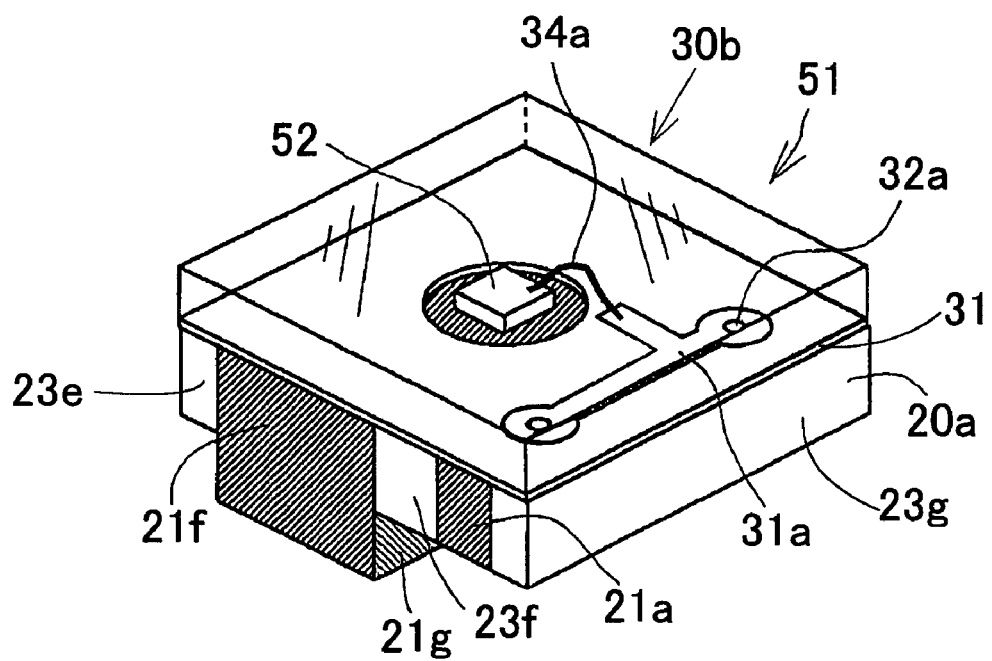
FIG. 9 is a perspective view showing a light emitting device according to a third embodiment of the present invention.

FIG. 9 is a perspective view showing a light emitting device according to a third embodiment of the present invention.

The light emitting device 51 comprises a base member 20a and a light emitting element assembly 30b. The base member 20a comprises the conductive member 21a, a conductive member 21f having heat and electricity conductivity, and insulation members 23e, 23f and 23g. An LED 52 is mounted on the conductive member 21f, so that an electrode on the underside of the LED is connected to the conductive member 21f. The circuit substrate 31 has only the pattern 31a which is connected to an electrode on the LED 52 by the wire 34a. Thus, the LED 52 is electrically connected to the conductive member 21a and electrically and thermally connected to the conductive member 21f as a heat sink.

In accordance with the third embodiment, since only the single pattern 31a and a pair of conductive members 21a and 21f are provided, the construction is simplified.

Next, method for manufacturing a plurality of the light emitting devices 30a of the first embodiment will be described hereinafter.

Figure 10:
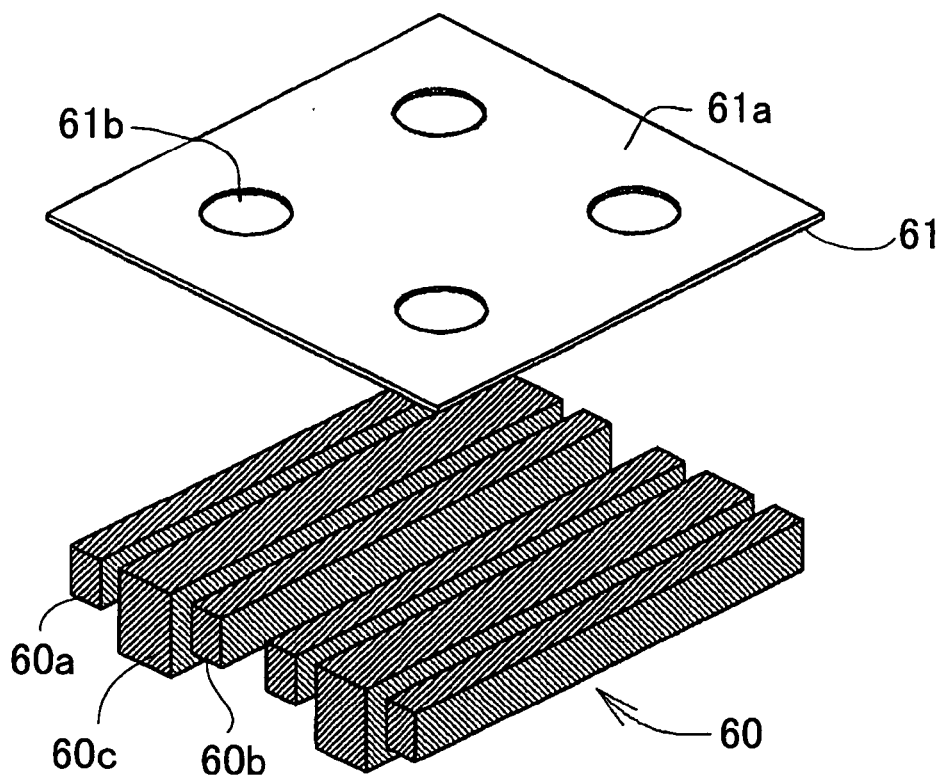
FIG. 10 is a perspective view of a conductive member assembly and a circuit substrate assembly showing a step for manufacturing a plurality of light emitting devices according to a first embodiment of the present invention.

FIG. 10 is a perspective view showing a conductive member assembly 60 and a circuit substrate assembly 61. The conductive member assembly 21 comprises six long conductive members 60a, 60b and 60c corresponding to the conductive members 21a, 21b and 21c.

The circuit substrate assembly 61 is made of resin and has a copper foil film 61a on the upper surface thereof. The circuit substrate assembly has four divisions and four openings 61b in the divisions.

Figure 11:
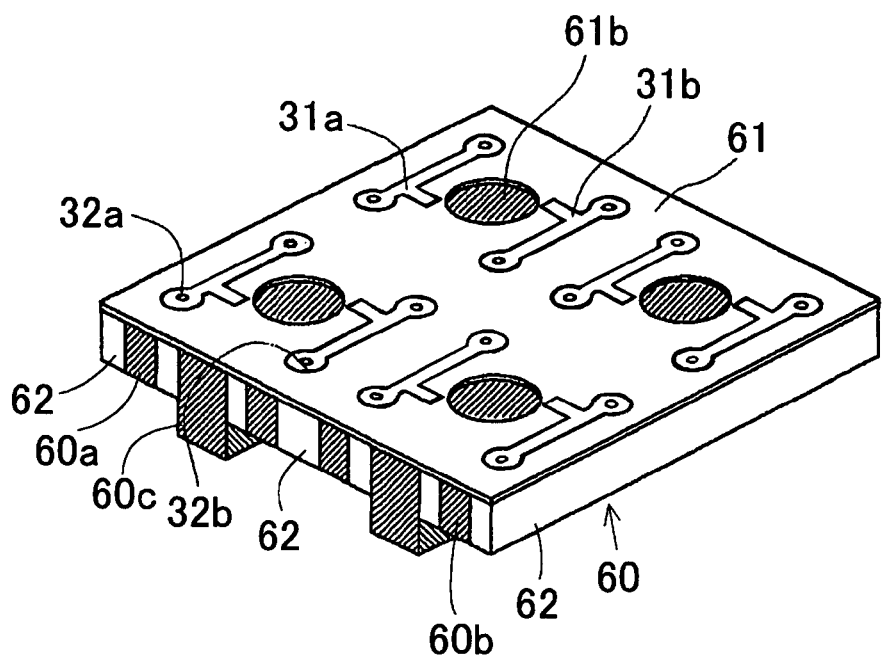
FIG. 11 is a perspective view of an assembly of the conductive member assembly and circuit assembly showing a step for manufacturing a plurality of light emitting devices according to a first embodiment of the present invention.

FIG. 11 is a perspective view of an assembly of the conductive member assembly and circuit assembly. The conductive members 60a, 60b and 60c are secured to the underside of the circuit substrate assembly 61 by the thermo compression bonding. Thereafter, the spaces between the conductive members 60a, 60b and 60c are charged with resin to form insulation members 62.

Next, a plurality of through-holes are formed and coated with copper, then by etching four sets of copper foil patterns 31a and 31b are formed at predetermined positions.

Figure 12:
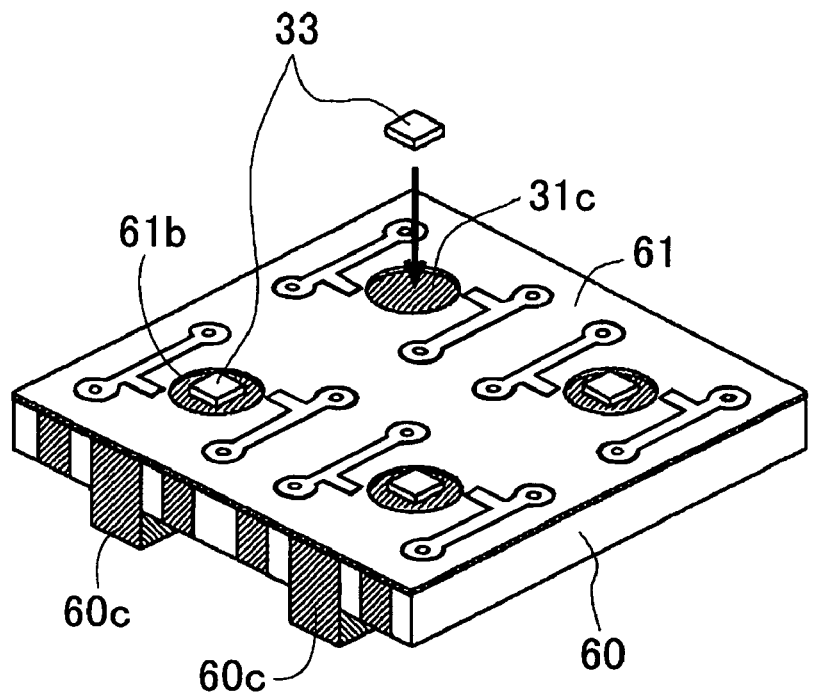
FIG. 12 is a perspective view showing an LED mounting step for manufacturing a plurality of light emitting devices according to a first embodiment of the present invention.

FIG. 12 is a perspective view showing an LED mounting step. The LED 33 is mounted on the conductive member 60c at the exposed portion in each of the openings 61b by a silver paste.

Figure 13:
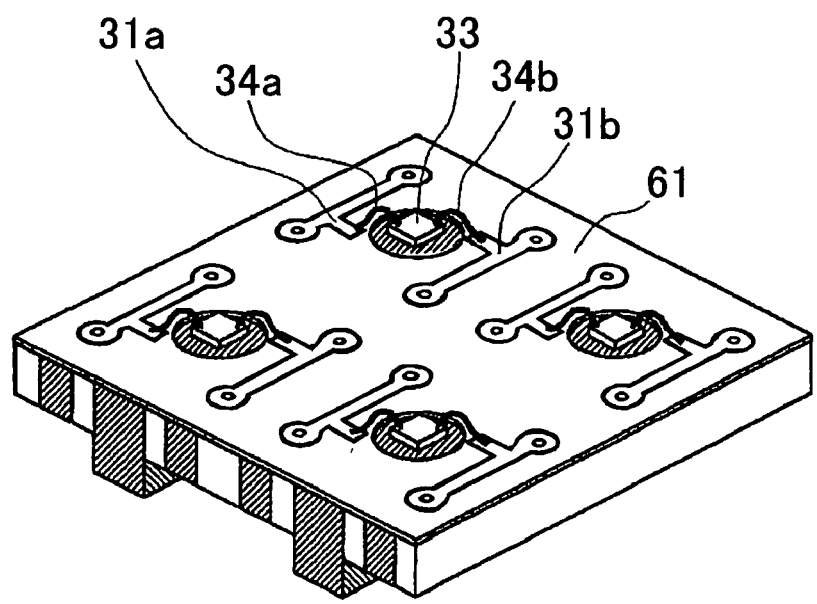
FIG. 13 is a perspective view showing a wire bonding step for manufacturing a plurality of light emitting devices according to a first embodiment of the present invention.

FIG. 13 is a perspective view showing a wire bonding step. Each LED 33 is electrically connected to the copper foil patterns 31a and 31b by the wires 34a and 34b.

Figure 14:
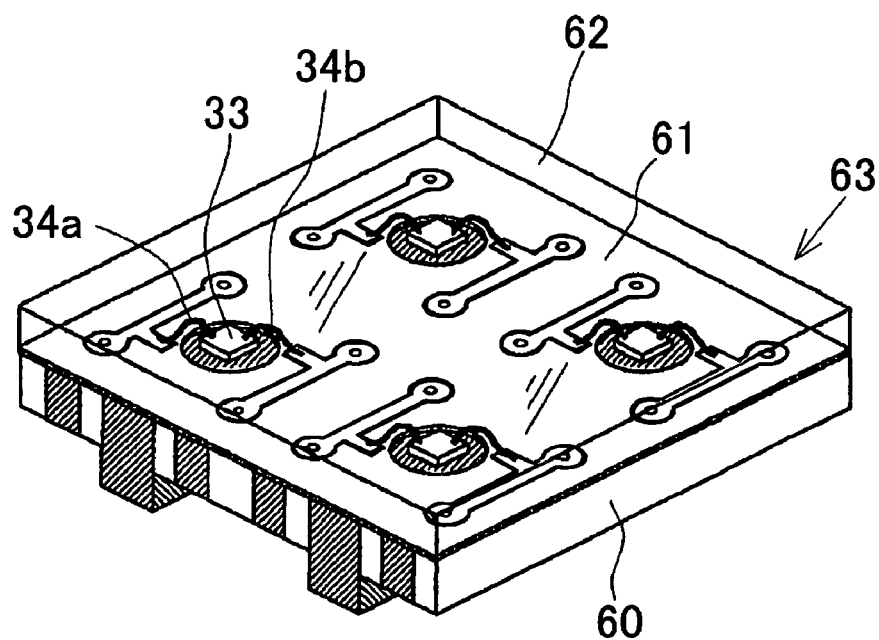
FIG. 14 is a perspective view showing a sealing step for manufacturing a plurality of light emitting devices according to a first embodiment of the present invention.

FIG. 14 is a perspective view showing an encapsulating step. As shown in FIG. 14, the upper surface of the circuit substrate assembly 61 is covered by an encapsulation member 62, thereby encapsulating each LED 33 and wires 34a and 34b. Thus, a light emitting device assembly 63 is finished.

Figure 15:
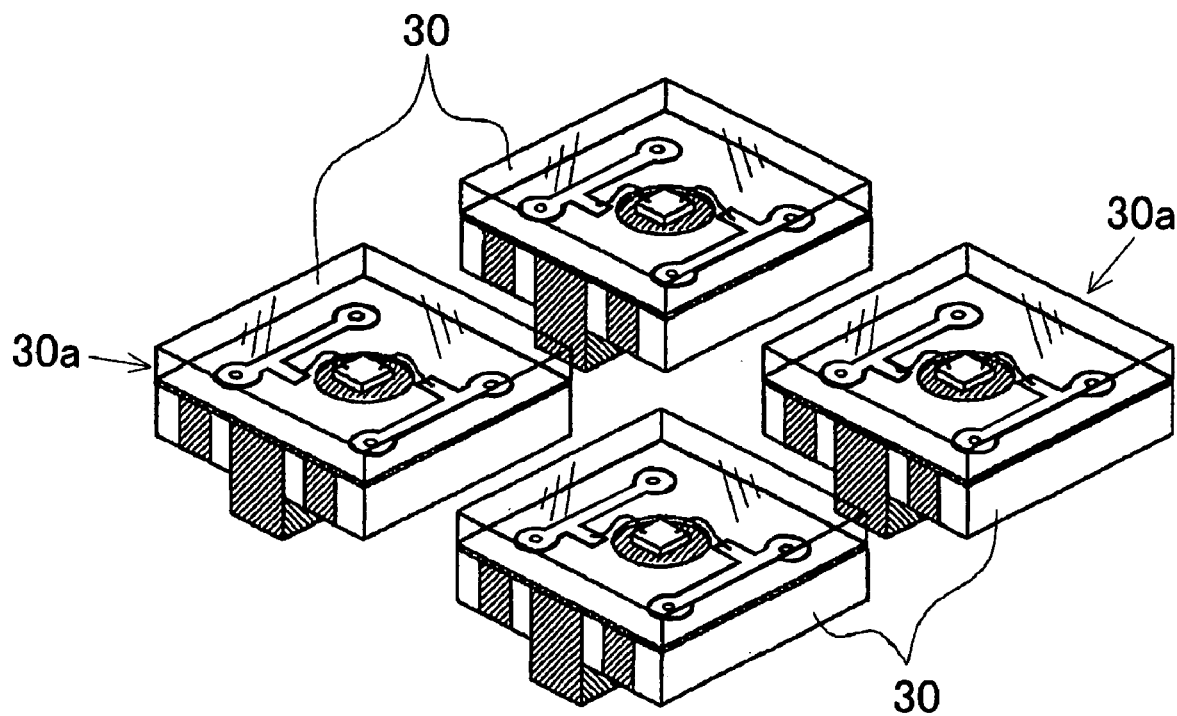
FIG. 15 is a perspective view showing a separating step of the light emitting device assembly for manufacturing a plurality of light emitting devices according to a first embodiment of the present invention.
Figure 16:
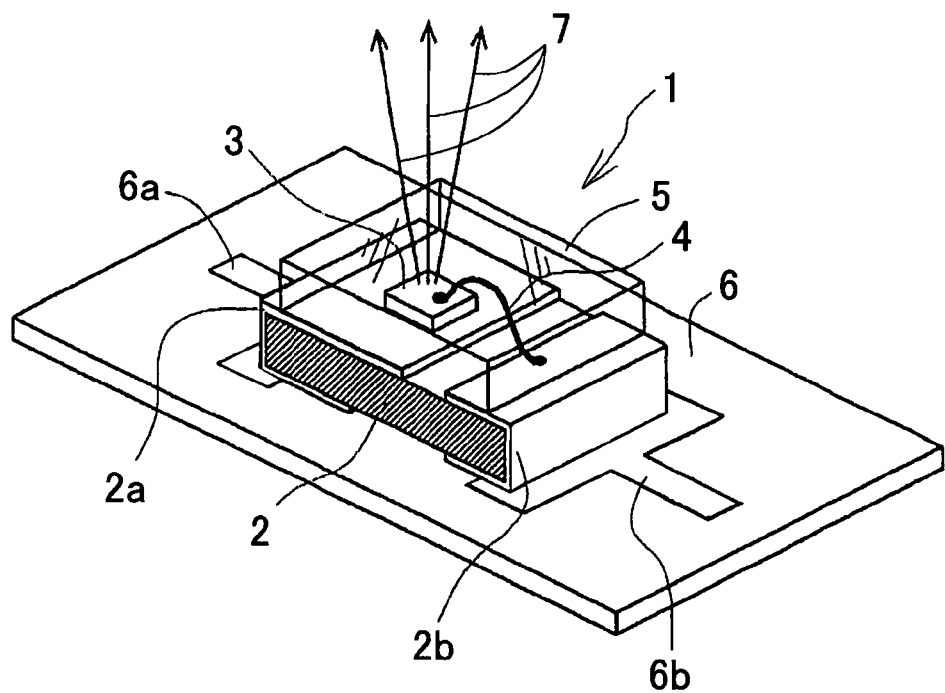
FIG. 16 is a perspective view showing a conventional light emitting device.
Figure 17:
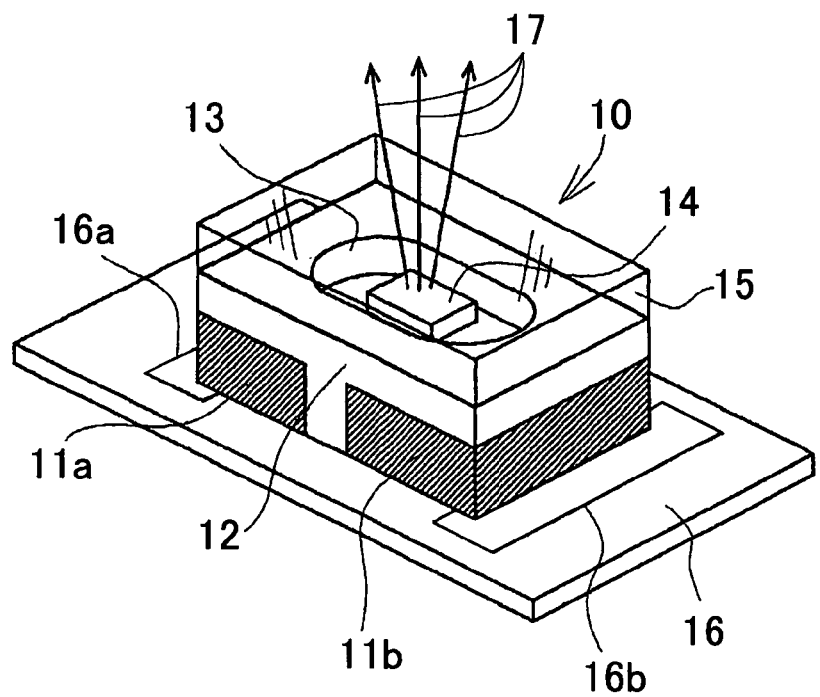
FIG. 17 is a perspective view of another conventional light emitting device.

FIG. 15 is a perspective view showing a separating step of the light emitting device assembly. The light emitting device assembly 63 is diced between adjacent divisions. Thus, four light emitting devices 30a are produced.

In accordance with the present invention, since the LED is directly mounted on a conductive member having a high heat conductivity, the LED is efficiently cooled. Therefore, the characteristic of the LED is kept so that the reliability of the LED is heightened.

While the invention has been described in conjunction with preferred specific embodiment thereof, it will be understood that this description is intended to illustrate and not limit the scope of the invention, which is defined by the following claims.

What is claimed is:

1. A light emitting device having an optical axis, comprising:
   a base member formed from a plurality of electric conductive members alternating with insulating members, the members being arranged in a direction perpendicular to the optical axis of the light emitting device, each of the insulating members being disposed to secure and isolate conductive members, the base member presenting first and opposite faces which are composed of alternating conductive and insulating members;

a circuit substrate having an opening and which is secured to the first face of the base member, the opening being provided for exposing a part of an upper surface of one of the conductive members;

a light emitting diode mounted on the exposed portion of the upper surface of the conductive member;

an electrically connecting means to connect the light emitting diode with at least two of the conductive members for applying current to the light emitting diode;

a sealing member covering the light emitting diode and the electrically connecting means for protection; and a projection outwardly extended for heat radiation from a side of the conductive member different from the side on which the light emitting diode is mounted.

2. The device according to claim 1 wherein the projection is connected to an external cooling member for heat radiation.

3. The device according to claim 2 further comprising an external print substrate secured to the base member at the opposite face thereof and having an opening so as to insert the projection of the conductive member and to contact the projection with the cooling member secured to the print substrate at the other side thereof.

4. The device according to claim 2 wherein the cooling member has a plurality of cooling fins.

5. A light emitting device having an optical axis, comprising:

a base member formed by combining at least first and second electric conductive members and insulating members, the members being arranged in a direction perpendicular to the optical axis of the light emitting device, each of the insulating members disposed to secure and isolate each of the conductive members;

a circuit substrate mounted on the base member, the circuit substrate having an opening which exposes a part of an upper surface of the first conductive member;

a light emitting diode mounted on the upper surface of the first conductive member within the opening; and electrical connecting means provided on the circuit substrate for electrically connecting the light emitting diode with at least the second conductive member.

6. The device according to claim 5, further comprising a projection projected from at least a surface different from the upper surface of the first conductive member.

7. The device according to claim 6, further comprising an external cooling member for heat radiation, wherein the projection is connected to the external cooling member.

8. The device according to claim 5, wherein the circuit substrate has at least one circuit pattern secured thereto and at least one wire connected between the circuit pattern and the light emitting diode so as to apply current to the light emitting diode.

9. The device according to claim 6, further comprising an external print substrate secured to the base member at an upper side thereof and having an opening so as to insert the projection of the conductive member and to contact the projection with the cooling member secured to the print substrate at the other side thereof.

10. The device according to claim 7, wherein the cooling member has a plurality of cooling fins.

11. A light emitting device having an optical axis, comprising:

a base member formed by combining at least three electric conductive members and insulating members, the members being arranged in a direction perpendicular to the optical axis of the light emitting device, each of the insulating members being disposed to secure and isolate each of the conductive members;

a circuit substrate mounted on the base member, the circuit substrate having an opening which exposes a part of an upper surface of a first of said conductive members;

a light emitting diode mounted on the upper surface of the first conductive member within the opening;

electrically connecting means provided on the circuit substrate for electrically connecting the light emitting diode with the second and third conductive members;

a projection outwardly extended for heat radiation from the other side of the upper surface of the first conductive member.

12. The device according to claim 11, wherein the projection is connected to an external cooling member for heat radiation.

13. The device according to claim 11, wherein the circuit substrate has at least one circuit pattern secured thereto and at least one wire connected between the circuit pattern and the light emitting diode so as to apply current to the light emitting diode.

14. The device according to claim 12, further comprising an external print substrate secured to the base member at an upper side thereof and having an opening so as to insert the projection of the conductive member and to contact the projection with the cooling member secured to the print substrate at the other side thereof.

15. The device, according to claim 12, wherein the cooling member has a plurality of cooling fins.

* * * * *